United States Patent
Mowry et al.

(10) Patent No.: US 8,373,244 B2
(45) Date of Patent: Feb. 12, 2013

(54) TEMPERATURE MONITORING IN A SEMICONDUCTOR DEVICE BY THERMOCOUPLES DISTRIBUTED IN THE CONTACT STRUCTURE

(75) Inventors: Anthony Mowry, Buda, TX (US); Casey Scott, Dresden (DE); Roman Boschke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 188 days.

(21) Appl. No.: 12/169,020

(22) Filed: Jul. 8, 2008

(65) Prior Publication Data

US 2009/0166794 A1    Jul. 2, 2009

(30) Foreign Application Priority Data

Dec. 31, 2007    (DE) .......................... 10 2007 063 228

(51) Int. Cl.
*H01L 31/058*    (2006.01)
(52) U.S. Cl. ................... 257/469; 257/E21.53; 374/179
(58) Field of Classification Search .................. 257/469, 257/467, E21.53
See application file for complete search history.

(56) References Cited

U.S. PATENT DOCUMENTS

| | | | | |
|---|---|---|---|---|
| 3,766,444 | A | 10/1973 | Bosch ....................... | 317/234 R |
| 4,207,481 | A | 6/1980 | Dobkin ......................... | 307/310 |
| 4,779,994 | A * | 10/1988 | Diller et al. ..................... | 374/29 |
| 5,726,481 | A * | 3/1998 | Moody .......................... | 257/467 |
| 5,969,639 | A * | 10/1999 | Lauf et al. ................ | 340/870.17 |
| 6,037,645 | A * | 3/2000 | Kreider ......................... | 257/467 |
| 6,072,165 | A * | 6/2000 | Feldman ........................ | 219/543 |
| 6,329,696 | B1 | 12/2001 | Tanaka ........................... | 257/419 |
| 7,187,053 | B2 * | 3/2007 | Boerstler et al. .............. | 257/467 |
| 2004/0264093 | A1 | 12/2004 | Boerstler et al. .............. | 361/103 |
| 2006/0019434 | A1 * | 1/2006 | Jeong et al. ................... | 438/152 |
| 2006/0056113 | A1 | 3/2006 | Fukushima | |
| 2006/0061406 | A1 * | 3/2006 | Takatori ........................ | 327/350 |

FOREIGN PATENT DOCUMENTS

| | | |
|---|---|---|
| DE | 44 18 207 C1 | 6/1995 |
| DE | 696 10 068 T2 | 4/2001 |
| KR | 1020050071911 A | 7/2005 |

OTHER PUBLICATIONS

PCT Search Report and Written Opinion from PCT/US2008/013312 dated Apr. 17, 2009.
Translation of Official Communication from German Patent Office for German Patent Application No. 10 2007 063 228.4 dated Mar. 3, 2011.
Translation of Official Communication from German Patent Application No. 10 2007 063 228.4 dated Sep. 27, 2011.

* cited by examiner

*Primary Examiner* — Wael Fahmy
*Assistant Examiner* — John C Ingham
(74) *Attorney, Agent, or Firm* — Williams, Morgan & Amerson, P.C.

(57) ABSTRACT

By forming thermocouples in a contact structure of a semiconductor device, respective extension lines of the thermocouples may be routed to any desired location within the die, without consuming valuable semiconductor area in the device layer. Thus, an appropriate network of measurement points of interest may be provided, while at the same time allowing the application of well-established process techniques and materials. Hence, temperature-dependent signals may be obtained from hot spots substantially without being affected by design constraints in the device layer.

17 Claims, 9 Drawing Sheets

TEMPERATURE MONITORING IN A SEMICONDUCTOR DEVICE BY THERMOCOUPLES DISTRIBUTED IN THE CONTACT STRUCTURE

BACKGROUND OF THE INVENTION

1. Field of the Invention

Generally, the present disclosure relates to the formation of integrated circuits, and, more particularly, to enhanced thermal sensing techniques in semiconductor devices.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors.

The increased packing density of integrated circuits resulting from the reduced device dimensions has given rise to the incorporation of more and more functions into a single semiconductor die. Furthermore, the reduced feature sizes may also be accompanied by reduced switching speeds of the individual transistors, thereby contributing to increased power consumption in MOS circuits, since the reduced switching speeds allow the operation of the transistors at higher switching frequencies, which in turn increases the power consumption of the entire device. In sophisticated applications using densely packed integrated circuits, the heat generation may reach extremely high values due to the dynamic losses caused by the high operating frequency, in combination with a significant static power consumption of highly scaled transistor devices owing to increased leakage currents that may stem from extremely thin gate dielectrics, short channel effects and the like. Therefore, great efforts are being made in order to reduce overall power consumption by restricting the usage of high performance transistors, which usually cause higher heat generation, to performance-critical signal paths in the circuit design, while using less critical devices in other circuit areas. Moreover, appropriate mechanisms may be implemented to operate certain circuit portions "on demand" and control local or global operating conditions, depending on the thermal situation in the semiconductor die. Since external heat management systems may not enable reliable estimation of the die-internal temperature distribution, due to the delayed thermal response of the package of the semiconductor device and the possibly insufficient spatial temperature resolution, respective external concepts may have to be designed to take into consideration these restrictions and provide sufficient operational margins with respect to heat control, or risk overheating and thus possibly destruction of specific critical circuit portions.

Manufacturers of semiconductor products, therefore, increasingly prefer accurate internal temperature measurements that do not substantially depend on external device conditions and dedicated thermal hardware components that may be subject to external tampering, while also avoiding the slow thermal response via the device package. For this purpose, sophisticated heat monitoring regimes may typically be incorporated into the overall design of the integrated circuit, which may enable a device-internal heat management, irrespective of external conditions. Thus, die-internal temperature measurements are typically performed in complex devices, such as CPUs, ASICs and the like, so as to provide device-internal data for controlling the overall operation by reducing operating frequency, switching off respective circuit portions and the like. A respective die-internal heat management system, therefore, relies on accurate temperature measurement. In many approaches, techniques for measuring the die-internal temperature or temperature gradients are accomplished by positioning temperature-sensitive circuits around the die in order to locally determine the temperature. The various temperature measurements may then be combined to provide a global measure of the die temperature, while also allowing a local assessment of the thermal conditions across the die, depending on the distribution of the temperature-sensitive circuits. Hence, the higher a spatial resolution of the measured temperature profile is desired, the more temperature-sensing locations and hence respective sensor circuits are required. The incorporation of a plurality of temperature-sensitive circuits, however, may result in a significant "consumption" of valuable real estate of the semiconductor die, which may typically cause a "competitive" situation during circuit design between actual circuit portions and temperature-sensitive areas. Therefore, frequently, the temperature-sensitive circuit portions are treated with reduced priority compared to the "actual" circuit portions, which may finally result in a circuit design in which the temperature-sensitive circuits are positioned in less than ideal temperature sensing locations. For instance, the design of performance-critical circuit portions of the device that may be operated at higher speed or frequencies may not be compatible with the provisions of sensor elements in these critical areas, for example, due to undesired lengthening of the signal routing and reduction of speed. Hence, although these performance-critical areas usually generate a significantly higher amount of heat, the temperature of such "hot spots" may not be reliably measured, since the temperature-sensitive circuits are positioned by the design constraints at distant locations. Therefore, in this case, damage of the performance-critical areas may occur or respective heat management strategies may be required to take into account the discrepancy of the measurement data and the actual thermal conditions in the performance-critical areas. Similarly, the thermal response of the temperature-sensitive circuits may be affected by the shielding effect of materials and structures that may be provided in the vicinity of the temperature-sensitive circuits. For example, due to the reduced heat dissipation capability of SOI (silicon-on-insulator) devices caused by the buried insulating layer, on which the actual "active" device layer is formed, the corresponding sensing of the momentary temperature in SOI devices is of particular importance, wherein, additionally, the design-dependent positioning of the temperature-sensitive circuits may further contribute to a less efficient overall temperature management in sophisticated SOI devices.

Frequently, for thermal sensing applications, an appropriate diode structure may be used wherein the corresponding characteristic of the diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may depend on temperature and other parameters. For thermal sensing applications, it may, therefore, typically be desirable to provide a substantially "ideal" diode characteristic in order to provide the potential for precisely estimating the temperature conditions within the semiconductor device. In SOI devices, a corresponding diode structure, i.e., the respective PN junction, is typically formed in the substrate material located below the buried insulating layer, above which is formed the "active" semiconductor layer used for forming therein the transistor elements. Thus, in addition to the shielding effect of the buried insulating layer, at least some additional process steps may be required, for instance, for etching through the semiconductor layer or a corresponding trench isolation area and through the buried insulating layer in order to expose the crystalline substrate material, thereby contributing to the overall process complexity. Furthermore, the temperature-sensing diodes, in combination with an appropriate evaluation circuit, may also be subject to similar design constraints as described above, irrespective of whether a bulk architecture or an SOI architecture is considered. Hence, currently employed die-internal temperature monitoring mechanisms, although providing significant advantages over external temperature management systems, may suffer from increased die area consumption, reduced proximity to hot spots and thermal isolation of the temperature-sensitive circuits, as will be briefly discussed with reference to FIG. 1.

FIG. 1 schematically illustrates a top view of a semiconductor device 100, which may be provided in the form of a semiconductor die including one or more complex circuits, such as CPU's, memory devices, input/output circuitry and the like. As previously explained, the semiconductor device 100 may have, depending on the overall design criteria, circuit portions of different performance characteristics, such as speed-critical signal paths and the like. Moreover, highly dense circuit areas may be provided, for instance, in the form of memory areas, such as static RAM areas, dynamic RAM areas and the like. For example, a device region 110 may represent an area including a plurality of high performance circuit elements, such as transistor elements having a reduced channel length in combination with a thin gate insulation layer, which may contribute to increased leakage currents, as previously explained. Consequently, upon operation of the device 100, significant heat may be generated in the region 110. Furthermore, an area 111 may represent a device area, in which the overall circuit design may impose tight restrictions with respect to the incorporation of temperature monitoring circuitry and sensors, thereby requiring a certain distance with respect to the high performance region 110. Furthermore, at certain device areas, which are compatible with the overall circuit design, a plurality of temperature-sensitive circuits 120 are typically provided, which include temperature-sensitive elements, such as diodes and the like, in combination with respective support circuitry to receive and evaluate or process temperature-dependent signals. It should be appreciated that the overall structure of the semiconductor device 100 may comprise any appropriate substrate material, such as silicon, and the like, above which is typically formed an appropriate semiconductor layer, such as a silicon-based material in and above which respective circuit elements, such as transistors, capacitors, diodes and the like, are formed in accordance with the technology standard under consideration.

The electrical connection of the individual circuit elements usually may not be accomplished on the same level in which the circuit elements are manufactured, but may require a plurality of additional wiring layers, also referred to as metallization layers, in which highly conductive metal lines which may comprise appropriate metals, such as aluminum, copper and the like, may be routed according to the specified circuit layout. The plurality of metallization layers are interconnected with each other by respective vias, that is, vertical metal-filled contact elements connecting metal lines and metal regions of adjacent stacked metallization layers. Furthermore, a so-called contact structure is provided on the basis of an appropriate dielectric material which encloses the circuit elements, such as the transistors and capacitors and the like, and which acts as an interface to the very first metallization layer. Within the contact structure, respective contact elements or contact plugs are positioned, which connect to respective contact areas of the circuit elements, such as gate electrodes, drain and source regions of transistors and the like. For example, frequently, a combination of silicon nitride, which might act as an etch stop material, followed by silicon dioxide, are common interlayer dielectric materials for the contact structure.

Thus, as previously explained, during operation of the semiconductor device 100, heat is generated in a spatially varying manner, depending on the position of performance-driven circuit portions, such as the device region 110 and the overall configuration of the semiconductor device 100. For instance, in moderately complex systems, in addition to highly complex digital circuits including extremely fast switching transistor elements, in other cases, circuit portions of different power levels may be integrated into the same semiconductor die, thereby also creating a different amount of heat during operation. Since the overall circuit design may not allow positioning of the temperature-sensitive circuits 120 at desired device areas, such as in the vicinity of the performance-driven circuit region 110, without requiring significant design modification, which may be accompanied by performance loss and the like, a reliable detection of the actual temperature in critical device areas may be difficult. Furthermore, coverage of the entire die area, except for less sensitive areas, such as the area 111, may require a plurality of temperature-sensitive circuits 120, which may conventionally consume valuable area in the device layer, i.e., in the semiconductor layer, which also accommodates the actual circuit elements. Hence, in conventional devices, the spatial resolution, as well as the accuracy of temperature-related information, may be lower than is desirable.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein provides semiconductor devices and methods for enhanced temperature sensing capabilities within a semiconductor die, while reducing area consumption and/or providing higher efficiency of evaluating temperatures of critical device regions and/or reducing thermal isolation, which may be caused by the presence of inappropriate materials between the point of interest and the actual sensor location. For this purpose, the present disclosure contemplates temperature-sensitive elements such as thermocouples which may be positioned in the contact structure, i.e., in the dielectric material provided between the device layer and the metallization system, thereby reducing the overall amount of required semiconductor area, since the actual temperature-sensitive components may be positioned above the semiconductor material. Furthermore, the contact structure is in close proximity to the actual circuit elements, thereby providing a substantially non-delayed thermal response of the temperature-sensitive elements and also maintaining thermal isolation of respective measurement points of interest at a low level. Moreover, the temperature-sensitive elements may be appropriately routed within the contact structure, for instance in the form of respective extension lines of thermocouples, thereby providing the potential for obtaining a temperature-sensitive signal from specified points of interest, while a respective associated circuitry for receiving the temperature-dependent signal may be positioned at any appropriate remote location. Thus, by appropriately routing the temperature-sensitive elements in the contact structure, a high degree of coverage of areas of interest may be accomplished, since the design constraints imposed by the contact structure are significantly more relaxed compared to the actual device layer, so that measurement points may be appropriately positioned above device areas, the design constraints of which may not allow the provision of temperature-sensitive circuitry in the device layer as previously explained. For example, thermocouple loops may be routed across the semiconductor die within the contact structure, while an interface to the associated support circuitry for the temperature-sensitive elements may be positioned at any appropriate location that is compatible with the overall circuit design.

One illustrative semiconductor device disclosed herein comprises a semiconductor layer formed above a substrate and a circuit element formed in the semiconductor layer, wherein the circuit element comprises a contact region. Moreover, the semiconductor device comprises an interlayer dielectric material formed above the circuit element and a contact element formed in the interlayer dielectric material so as to connect to the contact region. Finally, the semiconductor device comprises a temperature-sensitive element formed in the interlayer dielectric material, wherein the temperature-sensitive element is configured to provide a temperature-dependent signal.

A still further illustrative semiconductor device disclosed herein comprises a plurality of circuit elements formed in and above a semiconductor layer and an interlayer dielectric material enclosing the plurality of circuit elements. Furthermore, the semiconductor device comprises a thermocouple formed in the interlayer dielectric material.

One illustrative method disclosed herein comprises selecting a first location in an overall circuit design of a semiconductor device, wherein the first location corresponds to a device area for receiving a temperature signal by a temperature evaluation circuit of the semiconductor device. The method further comprises selecting a second location as a measurement site of interest in the semiconductor device and forming a temperature-sensitive element in an interlayer dielectric material that is formed between circuit elements of the semiconductor device and a first metallization layer of the semiconductor device, wherein the temperature-sensitive element comprises conductive lines extending from the first location to the second location.

BRIEF DESCRIPTION OF THE DRAWINGS

The disclosure may be understood by reference to the following description taken in conjunction with the accompanying drawings, in which like reference numerals identify like elements, and in which.

Figure 1:
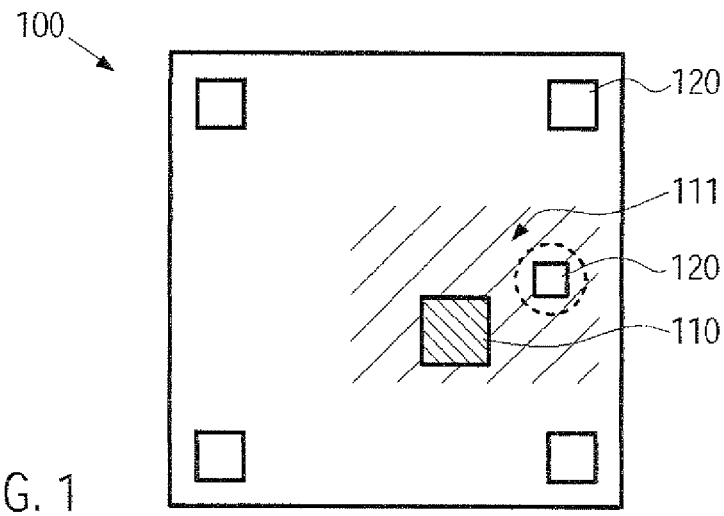
FIG. 1 schematically illustrates a top view of a conventional semiconductor die including a plurality of temperature sensitive circuits formed in the device layer and positioned in accordance with design constraints in the device layer.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to enhanced techniques for monitoring and/or controlling the temperature distribution in a semiconductor die by providing temperature-sensitive elements within the contact structure of the semiconductor device so as to allow the positioning of the temperature-sensitive elements with reduced constraints compared to conventional approaches, in which the temperature-sensitive circuits may typically be formed in the device layer, which may result in the above-explained deficiencies. Thus, by "using" the contact structure as a medium for forming therein temperature-sensitive elements, close proximity to the points actually generating heat may be accomplished, since the interlayer dielectric material encloses the respective circuit elements, while also less restrictive design constraints may provide the potential of appropriately routing the temperature-sensitive elements to any desired measurement point. That is, the contact structure is typically "populated" by vertical contact plugs or elements and respective interconnect structures, which may consume significantly less area compared to the underlying circuit elements, thereby enabling an efficient routine of temperature-sensitive elements even at device areas, in which the underlying device layer exhibits a moderately high packing density.

In some illustrative aspects disclosed herein, the temperature-sensitive elements may be provided in the form of thermocouples, which may include appropriate conductive lines within the interconnect structure, thereby enabling the application of well-established manufacturing techniques and materials so as to obtain a high degree of compatibility with existing semiconductor manufacturing regimes. Thermocouples are devices in which the thermoelectric effect is used, wherein a temperature gradient may result in a voltage in a conductor extending along a region exhibiting a temperature gradient. In order to actually access the voltage between two points of the conductive material at different temperatures, a further material is required for connecting to the conductor under consideration, wherein the additional conductor is also subject to the influence of the temperature gradient, which may cancel the net voltage, if the same material would be used for both conductors. Hence, different conductive materials have to be used, which exhibit a different degree of thermoelectric effect, thereby obtaining a net voltage that is indicative of the respective temperature gradient. Consequently, by appropriately routing a respective "couple" of conductors from a location, at which the voltage may be detected and which may have a specific temperature to a point of interest, for instance, a high temperature spot in the semiconductor device, the temperature thereof may be evaluated on the basis of the temperature gradient, while an appropriate routing regime for respective conductive lines of the thermocouple may provide the possibility of thermally monitoring any desired point in the semiconductor die, without consuming areas in the device layer, i.e., in the semiconductor layer, in which are formed the actual circuit elements. Moreover, a variety of thermocouples are available, that is, respective conductive materials in the form of metal-containing materials and the like, which may cover a broad range of temperatures, wherein a plurality of conductive materials may be available that may also be used in semiconductor manufacturing techniques, thereby providing a high degree of compatibility with existing technologies. For example, copper, constantan, i.e., a copper nickel alloy, platinum, rhodium and the like, may represent appropriate materials for forming thermocouples which are also partially involved in manufacturing techniques of modern semiconductor devices or which may at least be compatible with respective processes. Hence, appropriate materials and patterning and routing regimes may be used in the contact level of a semiconductor device, while a respective support circuitry, which may be provided in the form of appropriate analog and digital circuit portions, may be positioned at any appropriate location within the die, wherein temperature-related aspects may also be taken into consideration when selecting an appropriate position for the support circuitry. That is, the circuitry may be positioned in a die region that provides the desired temperature condition so as to obtain meaningful measurement data with respect to a temperature gradient between the specified position of the support circuitry and a measurement point of interest, such as a hot spot area and the like. In other cases, one or more thermocouples may be efficiently routed to respective reference positions, for instance, to define a cool junction area of well-defined temperature conditions during operation of the device, which may enhance the overall accuracy of the temperature monitoring.

Consequently, a dense network of thermal measurement sites may be efficiently integrated into a complex semiconductor product, while at the same time reducing consumption of semiconductor area compared to conventional strategies and also enhancing overall accuracy. Simultaneously, appropriate materials and process techniques may be used with a high degree of compatibility with existing semiconductor processes so that, in some illustrative aspects, well-established techniques may be used for patterning the contact structure without requiring the implementation of additional processes.

It should be appreciated that the principles disclosed herein are advantageous for complex integrated semiconductor devices such as CPUs and the like. Here, due to the complex circuit design, a high packing density, in combination with performance-driven circuit regions, may have to be provided so that enhanced coverage and accuracy of temperature monitoring and controlling may significantly contribute to overall enhanced device performance. The principles disclosed herein may, however, also be advantageously applied to any complex semiconductor devices, such as complex systems on a single chip, which may include analog circuitry in combination with digital circuitry and/or low voltage circuits in combination with high voltage circuits and the like, since, also in these cases, the respective contact structure may be advantageously used for positioning therein appropriate temperature-sensitive elements with increased accuracy and coverage. Thus, unless specifically set forth in the description or the appended claims, the principles disclosed herein should not be considered as being restricted to a specific design of a semiconductor device.

Figure 2A:
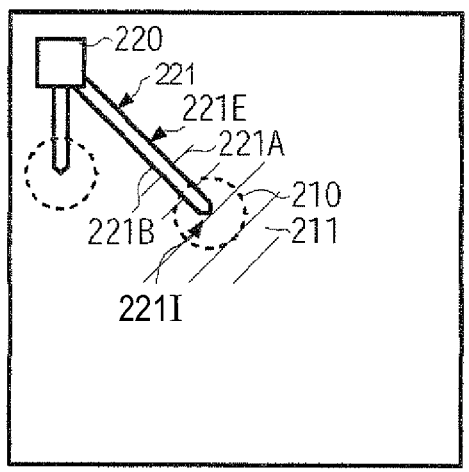
FIG. 2a schematically illustrates a top view of a semiconductor die comprising a thermocouple formed in a contact structure positioned above the device layer, thereby enabling the routing of the thermocouple extension lines to a point of interest in the contact structure, according to illustrative embodiments.

FIG. 2a schematically illustrates a top view of a semiconductor device 200, which may represent any semiconductor device including circuit portions formed on the basis of circuit elements (not shown), which may be formed in and above an appropriate semiconductor layer, such as a silicon-based layer, as the vast majority of complex integrated circuits are currently, and will be in the near future, formed on the basis of silicon material. It should be appreciated that the respective semiconductor layer may, however, be comprised of any other appropriate material or material composition, depending on the overall device requirements. In the embodiment shown, the semiconductor device 200 may represent a semiconductor die which may comprise a substrate, a semiconductor layer and respective circuit elements which will be described later on in more detail, wherein the circuit elements may be grouped into respective functional blocks in accordance with the design of the semiconductor device under consideration. For instance, in the respective semiconductor layer, a region 211 may represent a functional area in which the presence of other functional elements, such as temperature-sensing elements, may not be compatible with design constraints, as previously explained. Nevertheless, within or in the vicinity of the area 211, a measurement site of interest 210 may be provided, which, for instance, may represent a region of increased temperature generation during operation of the semiconductor device 200. For example, the measurement site 210, which may also be referred to as a measurement location, may represent an area including a speed-critical signal path or high voltage circuit elements, which may result in enhanced heat generation during operation. It should be appreciated that a "location" in the semiconductor device 200 may be understood herein as a specified position and a corresponding "neighborhood," which may range from several micrometers to several tenths or hundreds of micrometers, depending on the lateral extension of the respective circuit elements defining a temperature-sensitive element. As previously explained, the respective circuit elements defining the areas 211 and the measurement site 210 may be enclosed by an appropriate dielectric material which may be referred to as an interlayer dielectric material, which separates the circuit elements from actual metallization levels, in which layer-internal metal lines may be routed in accordance with the overall circuit layout. Thus, the respective interlayer dielectric material may comprise a plurality of "vertical" contact elements or plugs which connect at one end to circuit elements and connect at the other end to respective metal regions in the very first metallization layer.

It should be appreciated that a plurality of interconnect structures may also be provided within the interlayer dielectric material so as to connect different circuit elements or different contact regions of the same circuit element without providing a connection to the overlying first metallization layer. However, compared to the area consumed by circuit elements in the device layer, the area occupied by respective contact plugs and interconnect structures in the interlayer dielectric material is significantly less, thereby providing available space for one or more temperature-sensitive elements 221, which in some illustrative embodiments, may be provided in the form of thermocouples, i.e., conductive lines of appropriate material composition so as to allow the detection of a temperature-dependent voltage. The one or more temperature sensitive elements 221 may be connected to one or more appropriate support circuits 220, which may be positioned at any appropriate location in the device level so as to be compatible with design and temperature considerations. The temperature sensitive elements 221 may comprise an extension portion 221E which extends from above the circuit 220 to the measurement site of interest 210 and which connects to an interface portion 221I in which an interface is formed between a first conductive line 221A and a second conductive line 221B, which are comprised of different conductive materials. For example, for a thermocouple of type T, the element 221 may comprise the metal line 221A in the form of a copper material, while the metal line 221B may be provided in the form of a constantan, that is, a copper nickel alloy. In this case, the element 221A may be appropriate for being operated with a temperature range from approximately −200° C. to approximately +300° C., wherein a voltage of approximately 43 micro volts per ° C. of temperature difference between the interface portion 221I and the termination of the extension portion 221E may be obtained. That is, for a temperature difference between the measurement location 210 and the region corresponding to the support circuitry 220 of 100° C., a voltage of approximately of 4.3 millivolt (mV) may be obtained. It should be appreciated that a plurality of conductive materials, such as silver, tungsten, nickel alloys, cobalt, molybdenum, gold, platinum, rhodium and the like, may be used, wherein many of these materials may already be used during the manufacturing of complex semiconductor devices. In other cases, appropriate semiconductor materials may also be used in combination with a metal or in combination with other semiconductor materials so as to provide an appropriate thermocouple positioned within the contact structure of the device 200.

The semiconductor device 200 may be formed on the basis of well-established process techniques, when the device level is considered, wherein, however, contrary to conventional strategies, the support circuit 220 may be appropriately adapted to the requirements of the temperature-sensitive elements 221. That is, appropriate analog and/or digital circuit portions may be provided to receive the temperature-dependent signal from the elements 221 and perform an appropriate evaluation of the temperature-dependent signal, which may be accomplished on the basis of an appropriate control unit (not shown) which may control the operation of the device 200 on the basis of the evaluated temperature signal. It should be appreciated that respective circuitry in combination with thermocouples is well established in discrete circuit topologies and respective circuit topologies may readily be implemented into the overall design of the device 200. Furthermore, it is to be noted that the evaluation of the temperature-dependent signals may be performed by an appropriate functional block of the device 200, which may not necessarily be implemented within the support circuitry 220 but may also be implemented in a respective digital functional block, such as a CPU core, dedicated temperature control units and the like. It should be appreciated that evaluation of a temperature-dependent signal may be understood such that any type of signal processing may be performed in order to obtain a temperature-related signal, which may be used for the further monitoring or control of the device 200. For instance, evaluation of a temperature-dependent signal obtained by the element 221 may be accomplished by comparing the signal, possibly after appropriate signal processing, with one or more threshold levels, each of which may indicate a specific temperature-dependent status of the device 200.

Thus, after forming the respective circuit elements, an interlayer dielectric material may be formed, for instance, on the basis of well-established techniques and materials, wherein appropriate manufacturing processes are incorporated to form the element 221, as will be described later on in more detail. In some illustrative embodiments, appropriate trenches may be formed, at least in a portion of the interlayer dielectric material which may be subsequently filled with an appropriate conductive material, such as a metal-containing material, to thereby form the metal lines 221A, 221B, wherein the routing of the trenches may be accomplished such that respective contact plugs (not shown) of actual circuit elements may be circumvented while nevertheless positioning the interface portion 221I within the location 210. For this purpose, appropriately designed lithography masks may be used when forming the respective trenches in an appropriate patterning sequence, as will be explained later on. After filling in the appropriate conductive materials to complete the temperature-sensitive elements 221, further processing may be continued by forming a respective metallization structure on the basis of well-established techniques, substantially without requiring significant modifications compared to conventional strategies, except for appropriately connecting the one or more support circuits 220 in accordance with the required overall circuit layout. Hence, upon operation of the device 200, respective temperature-dependent information may be obtained from measurement sites of interest, such as the areas 210, substantially without being restricted to any design constraints within the device level, except for taking into consideration respective contact plugs provided so as to connect to the circuit elements, above which the element 221 is routed.

Figure 2B:
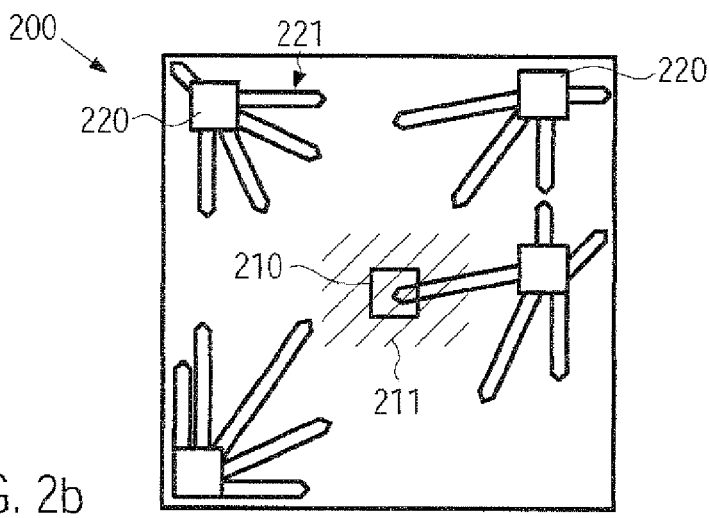
FIG. 2b schematically illustrates a semiconductor die comprising a plurality of locations for accommodating respective support circuitry for evaluating temperature-dependent signals obtained from a plurality of thermocouples extending within the contact structure so as to obtain a high degree of coverage, according to further illustrative embodiments.

FIG. 2b schematically illustrates the semiconductor device 200 according to further illustrative embodiments, in which increased coverage of the overall die area may be obtained by providing a plurality of support circuits 220, wherein each of which may represent an interface to a plurality of temperature sensitive elements 221 having a configuration as is described with reference to FIG. 2a. Thus, even a high degree of coverage may be accomplished in a sensitive device area, such as the area 211, in which design constraints may not allow the provision of conventional temperature sensitive circuits. As shown, according to the principles disclosed herein, the reduced area consumed by actual interconnect structures and contact plugs in the interlayer dielectric material may provide a high degree of flexibility of routing the respective extension portions 221E, while also allowing an appropriate positioning of the support circuit 220, which may also act as an area of "constant" temperature for a plurality of end points of elements 221, the other end of which is positioned in the corresponding measurement sites of interest, such as the area 210, and the like. Thus, a respective network of measurement sites may be established within the semiconductor device 200, the density of which may be selected in accordance with device requirements, substantially without increasing the overall lateral size of the device 200.

Figure 2C:
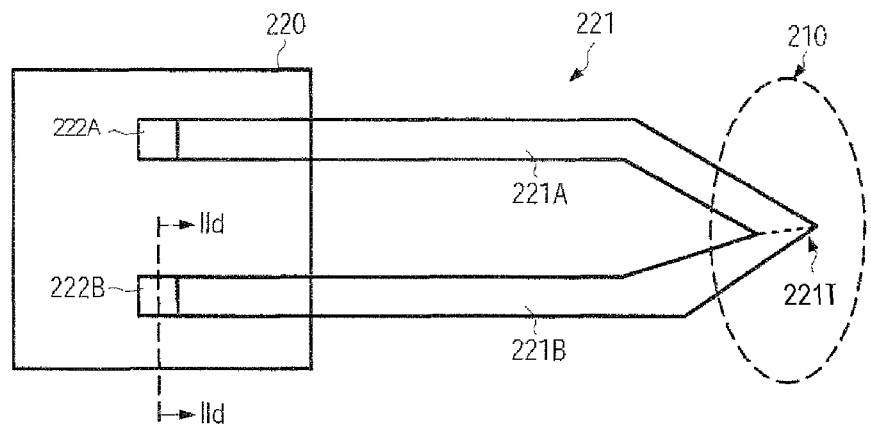
FIG. 2c schematically illustrates a top view of a thermocouple connected to the device layer, according to illustrative embodiments.

FIG. 2c schematically illustrates a top view of a single element 221 comprising the conductive lines 221A, 221B formed of different conductive materials, thereby forming the interface portion 221I as previously explained. Furthermore, respective elements or plugs 222A and 222B may be provided so as to connect to the respective conductive lines 221A, 221B and also to contact areas of circuit elements in the support circuitry 220. In some illustrative embodiments, the contact elements 222A, 222B may be comprised of the same material as the lines 221A, 221B to which the elements 222A, 222B may be connected. For example, in some illustrative embodiments, the line 221A may be comprised of any appropriate material, such as copper and, thus, the contact plug 222A may also be comprised of copper. Similarly, the line 221B may be comprised of, for instance, constantan and, thus, the plug 222B may also be comprised of constantan. In this manner, any deleterious effects of interfaces formed by the lines 221A, 221B with any appropriate electrode material may be avoided, unless the temperature-dependent voltage is coupled into a respective circuit element of the circuitry 220. In other illustrative embodiments, the contact elements 222A, 222B may be formed of any other appropriate material, for instance, both elements 222A, 222B may be formed of the same material, which may be the same or different compared to one or both of the materials in the lines 221A, 221B.

Figure 2D:
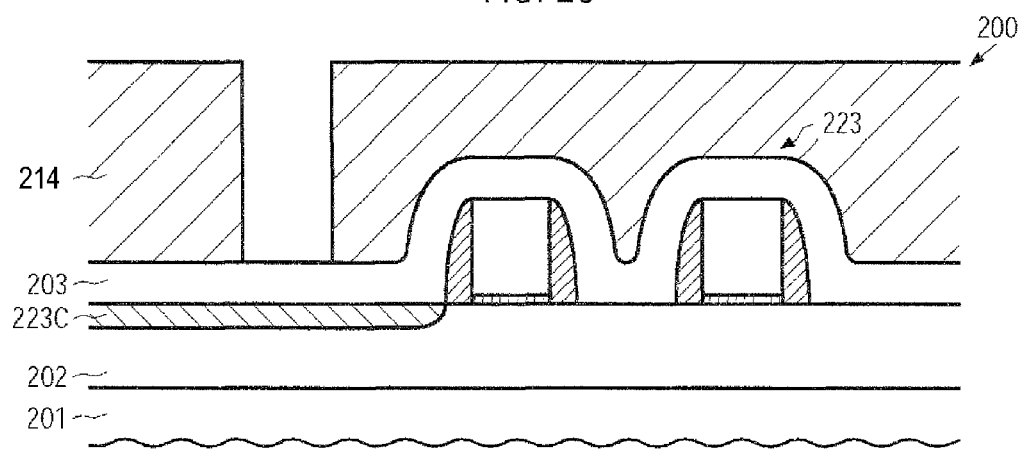
FIGS. 2d-2f schematically illustrate cross-sectional views of a portion of a thermocouple and respective contact plugs connecting extension lines to the device layer, according to illustrative embodiments.

FIG. 2d schematically illustrates a cross-sectional view of the device 200 along the line IId, as indicated in FIG. 2c. In the manufacturing stage shown in FIG. 2d, the conductive lines 221A, 221B may not yet be provided. Thus, in this manufacturing stage, the device 200 may comprise a substrate 201, which may be provided in the form of any appropriate material, as previously explained, above which may be formed a semiconductor layer 202. In and above the semiconductor layer 202 may be formed circuit elements, for instance, in the form of transistors, capacitors, resistors and the like, which are collectively indicated as circuit elements 223. In the embodiment shown, the circuit elements 223 may belong to the support circuitry 220, wherein, for convenience, any other circuit elements, for instance, corresponding to the device areas 211, 210, are not shown in FIG. 2d. The circuit elements 223 may comprise appropriate contact regions 223C to receive a temperature-dependent voltage or signal provided by the elements 221. For example, the contact region 223C may be comprised of a highly doped semiconductor material, metal-containing material, such as a metal silicide, and the like. Furthermore, in this manufacturing stage, a first portion of an interlayer dielectric material, for instance, in the form of an etch stop layer 203, may be formed above the semiconductor layer 202 and the circuit elements 223. For instance, frequently, an interlayer dielectric material comprised of silicon nitride, which may act as an etch stop material and/or as a strain-inducing material in sophisticated silicon-based semiconductor devices, in combination with a silicon dioxide material, may be used. It should be appreciated that the layer 203 may represent any appropriate material or materials acting as a portion of an interlayer dielectric layer, depending on the specific requirements for the device 200. In some illustrative embodiments, as shown, the layer 203 may be provided as a substantially conformal layer, thereby substantially resembling the surface topography created by the circuit elements 223. In other cases, the layer 203 or a combination of different layers may be formed so as to obtain a substantially planar surface topography in order to enhance the overall patterning of the layer 203, as will be described later on in more detail. In the manufacturing stage shown, an etch mask, for instance, in the form of a resist mask 214 may be provided to define an opening corresponding to the contact element 222B (FIG. 2c).

The semiconductor device 200 as shown in FIG. 2d may be formed on the basis of substantially the same process technique as described with reference to FIG. 2a. That is, after forming the circuit elements 223, for instance, in compliance with functional and layout requirements as demanded by the support circuitry 220, and also by design requirements as demanded by circuit elements in other device regions not involved in the temperature control of the device 200, the layer 203 may be formed, for instance, on the basis of well-established chemical vapor deposition (CVD) techniques, for instance, plasma enhanced chemical vapor deposition (PECVD), which may typically be used in combination with silicon nitride materials, silicon carbide materials and the like. It should be appreciated that, in sophisticated applications, the layer 203 may be provided as a highly stressed material, at least in dedicated circuit areas, depending on the overall requirements. Next, the mask 214 may be formed on the basis of well-established photolithography techniques and an appropriate etch process may be performed to remove material of the layer 203 and expose the underlying contact region 223C. For this purpose, a plurality of well-established etch recipes, such as plasma-assisted recipes and the like, are available in the art and may be used. In some illustrative embodiments, respective openings in the layer 203 may be patterned for the contact elements 222B, 222A in a common process, while, in other cases, separate patterning processes may be used, wherein, after each patterning process, a respective deposition step may be performed to provide the desired material for the respective contact elements 222B, 222A, which may then be formed of different materials.

Thus, after patterning the layer 203, an appropriate material may be filled in by an appropriate deposition technique. For instance, a copper-based material may be formed on the basis of well-established electrochemical deposition techniques, wherein an appropriate seed layer may be formed by sputter deposition and the like. For example, based on the etch mask 214, an appropriate seed layer may be deposited, which may then be removed commonly with the etch mask 214 so that the seed layer is only provided within an opening in the dielectric layer 203. In some illustrative embodiments, the respective deposition process may be performed as a highly directional deposition process, thereby providing a substantial amount of seed material at the bottom, i.e., on the exposed contact region 223C, while maintaining the amount of seed material at horizontal portions of the mask 214 and a respective opening in the layer 203 at a low level. During a subsequent electroless plating process, the desired material, such as copper, may be filled from bottom to top in a highly localized manner. Thereafter, any residuals may be removed by an appropriate selective etch process and subsequently the layer 203 may be patterned again so as to form an opening corresponding to the contact element 222A. In other cases, when the contact openings are formed in a common patterning process, the same seed material may be used for both openings. During the actual wet chemical deposition, one of the openings may be masked and, thereafter, the other already filled opening may be masked during filling of the previously masked contact opening. It should be appreciated, however, that any other appropriate manufacturing regime may be used for forming the contact elements 222A, 222B. For instance, the same material may be used for the contact plugs 222A, 222B, wherein any appropriate material may be used, such as tungsten and the like. In other cases, the contact elements 222A, 222B may be formed in a common manufacturing process together with the conductive lines 221A, 221B, as will be described later on. It should further be appreciated that, depending on the material used, a barrier layer may be formed prior to actually depositing a seed layer and the actual conductive material. For instance, if a direct contact of copper-based materials with the contact region 223C is considered inappropriate, respective barrier materials, such as tantalum, tantalum nitride, titanium, titanium nitride and the like, may be provided.

Figure 2E:
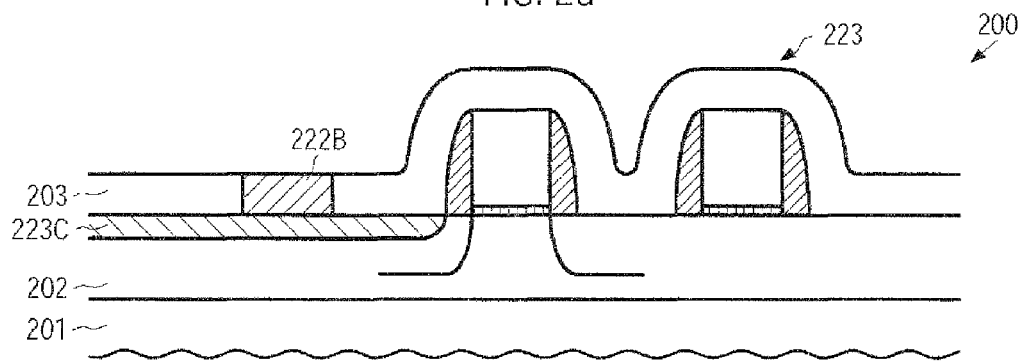

FIG. 2e schematically illustrates the semiconductor device 200 after the above-described process sequence. Hence, the contact plug 222B may be formed in the dielectric layer 203, possibly in combination with an appropriate barrier material, if required. Therefore, the contact plug 222B may provide a contact between the circuit elements 223 and one of the conductive lines, i.e., the conductive line 221B of the element 221 still to be performed.

Figure 2F:
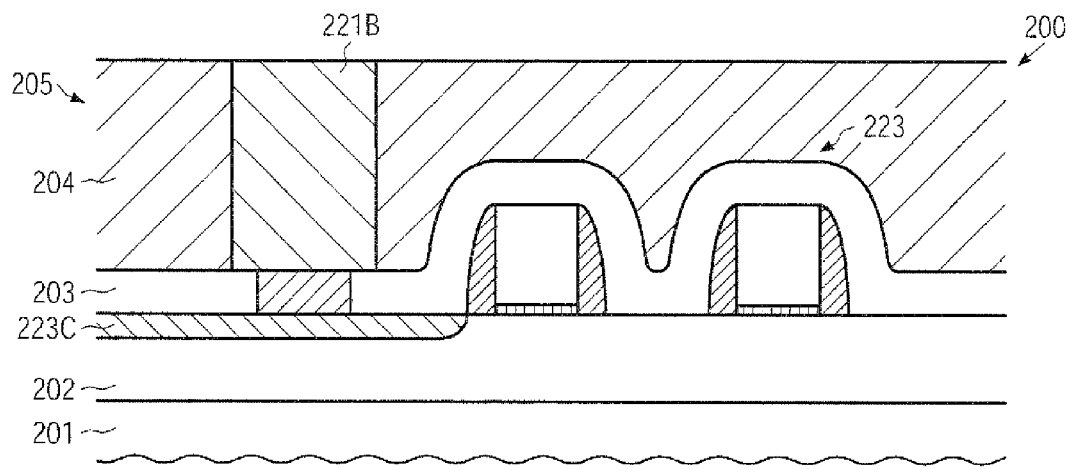

FIG. 2f schematically illustrates the semiconductor device 200 in a further advanced manufacturing stage. As shown, a further dielectric layer 204 may be provided above the layer 203, wherein the layer 204 may comprise one or more different materials, depending on the overall device requirements. The dielectric layers 203, 204 may form an interlayer dielectric material, commonly referred to as material 205, in a portion of which, i.e., the dielectric layer 204, the temperature-sensitive element 221 may be formed. In the embodiment shown, the conductive line 221B may be formed in the layer 204 so as to connect to the contact plug 222B, wherein, as previously explained, in some illustrative embodiments, the plug 222B and the line 221B may be comprised of substantially the same material. In other cases, the actual interface between the support circuitry 220 and the temperature sensitive-element 221 may be defined by an interface between the plug 222B and the line 221B, if comprised of different materials. Furthermore, if a direct contact of the layer 205 with the conductive material in the line 221B is considered inappropriate, an appropriate dielectric barrier material may be provided. Hence, if the increased diffusivity of copper atoms in silicon dioxide is considered inappropriate, at least the sidewall portions of the conductive line 221B may be covered by an appropriate material, such as silicon nitride, silicon carbide and the like, as will also be described in more detail in reference to FIGS. 2j-2o.

The semiconductor device 200 as shown in FIG. 2f may be formed on the basis of the following processes. After forming the contact plugs 222A, 222B, the dielectric layer 204 may be deposited, for instance, on the basis of well-established chemical vapor deposition (CVD) techniques, such as plasma enhanced CVD, thermally activated CVD and the like, wherein any appropriate material may be used, for instance, silicon dioxide material that may be deposited on the basis of TEOS. Depending on the overall surface topography, the layer 204 may be planarized, for instance, by chemical mechanical polishing (CMP) and the like. Thereafter, an appropriate resist mask may be formed by well-established lithography techniques and subsequently an etch recipe may be used for etching through the layer 204, thereby using the layer 203 as an efficient etch stop material. Thereafter, the respective trench may be filled with a desired material, as specified above, wherein appropriate deposition techniques may be used, such as CVD, electrochemical deposition techniques and the like. Thereafter, any excess material may be removed, for instance, on the basis of CMP, etch techniques and the like.

Figures 2G, 2H:
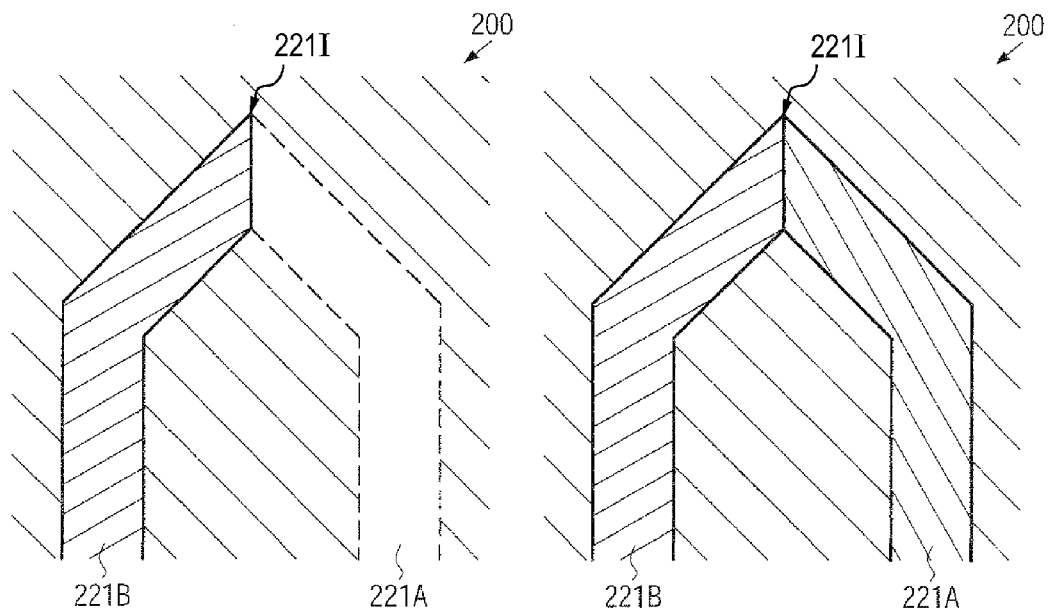
FIGS. 2g-2i schematically illustrate top views of a portion of a thermocouple in accordance with illustrative embodiments disclosed herein.

FIG. 2g schematically illustrates a top view of the semiconductor device 200 after the above-described process sequence. It should be appreciated that the interface portion 221I and a part of the lines 221A, 221B is illustrated only. As shown, the conductive line 221B may be formed so as to extend to a desired measurement site, as previously explained, while the respective line 221A is still to be formed, as indicated by the dashed lines. Thus, a patterning sequence may be performed to provide a corresponding trench, which then may be filled with an appropriate material on the basis of deposition techniques similar to those used for the formation of the conductive line 221B. Thereafter, any excess material may be removed, for instance, by CMP and the like so as to obtain electrically insulated lines 221A, 221B, except for a common interface in the portion 221I.

FIG. 2h schematically illustrates a top view of the device 200 after the end of the above-described process sequence. Hence, the conductive lines 221A, 221B, comprised of different conductive materials, may be formed in the interlayer dielectric material 205 and may be connected to the support circuitry 220 by means of the contact plugs 222A, 222B, which may be comprised of the same or different materials as the respective lines 221A, 221B, as previously explained. It should be appreciated that the conductive lines 221A, 221B may have any appropriate shape so as to extend into the desired measurement site and to avoid contact with other contact plugs of circuit elements not belonging to the support circuitry 220, while also the size and configuration of the interface portion 221I may be selected on the basis of layout or other considerations. It should be appreciated that other contact elements may be formed prior to, commonly with or after the formation of the conductive lines 221A, 221B, depending on the overall process strategy. Furthermore, in some illustrative embodiments, an additional dielectric material may be deposited so as to substantially completely embed the conductive lines 221A, 221B in the interlayer dielectric material 205. Thereafter, well-established process techniques to form actual contact elements may be applied.

Figure 2I:
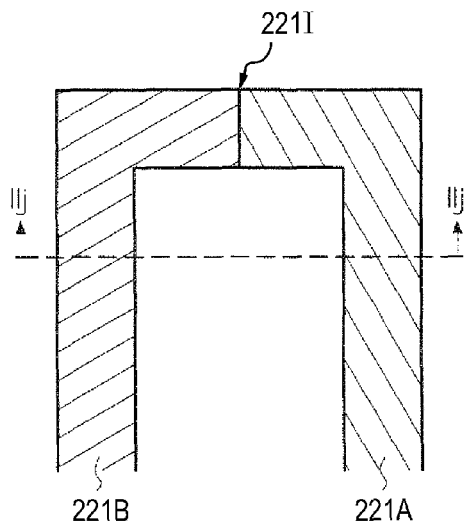

FIG. 2i schematically illustrates a portion of the element 221, in which the interface portion may have an essentially linear configuration, whereas, in other cases, any other appropriate configuration may be selected, in accordance with device requirements.

With reference to FIGS. 2j-2o, further illustrative embodiments will now be described, in which a metal material may be used for at least one of the conductive lines 221A, 221B, which may require appropriate confinement so as to avoid undue interaction with the surrounding dielectric materials.

Figure 2J:
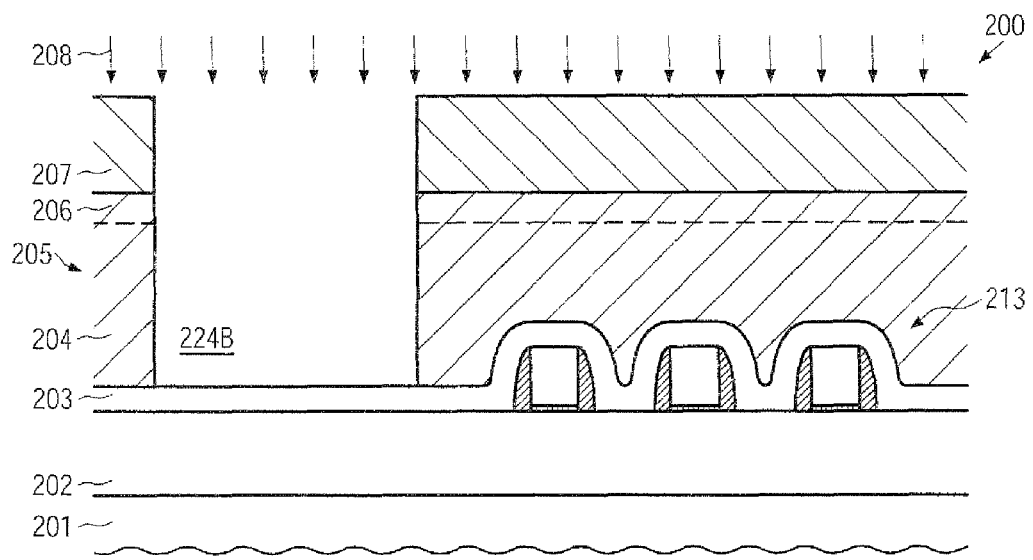
FIGS. 2j-2n schematically illustrate cross-sectional views of a "tip" portion of a thermocouple during various manufacturing stages in forming a respective interface between two different conductive materials, according to illustrative embodiments.

FIG. 2j schematically illustrates a cross-sectional view corresponding to the line IIj in FIG. 2i. As shown, the device 200 may comprise a plurality of circuit elements 213 which may belong to a circuit portion located within a measurement site of interest, such as the measurement site 210 (FIG. 2a). Moreover, in the manufacturing stage shown, trenches 224A, 224B may be formed in the dielectric layer 204, which, in the embodiment shown, may additionally comprise a cap layer 206, which may provide enhanced metal confinement during the further processing. Moreover, an etch mask 207 is provided to define the trenches 224B, 224A during an etch process 208. Thus, the trenches 224A, 224B may be formed during the common etch process 208, wherein, in a first etch step, it may be etched through the cap layer 206 if provided, followed by an etch step through the dielectric material 204 on the basis of well-established process techniques, wherein the layer 203 may act as an etch stop layer. Next, the etch mask 207 may be removed and, subsequently, a dielectric barrier layer may be formed on the dielectric material 205 and within the openings 224A, 224B. For example, in some illustrative embodiments, a direct contact of a metal material, such as copper, with a dielectric material of the layer 204 may be considered inappropriate, since copper may readily diffuse in silicon dioxide based materials. Thus, an appropriate dielectric barrier material, such as silicon nitride, silicon carbide and the like, may be provided as a barrier material, while not affecting the thermal and electrical characteristics of the conductive lines 221A, 221B still to be formed.

Figure 2K:
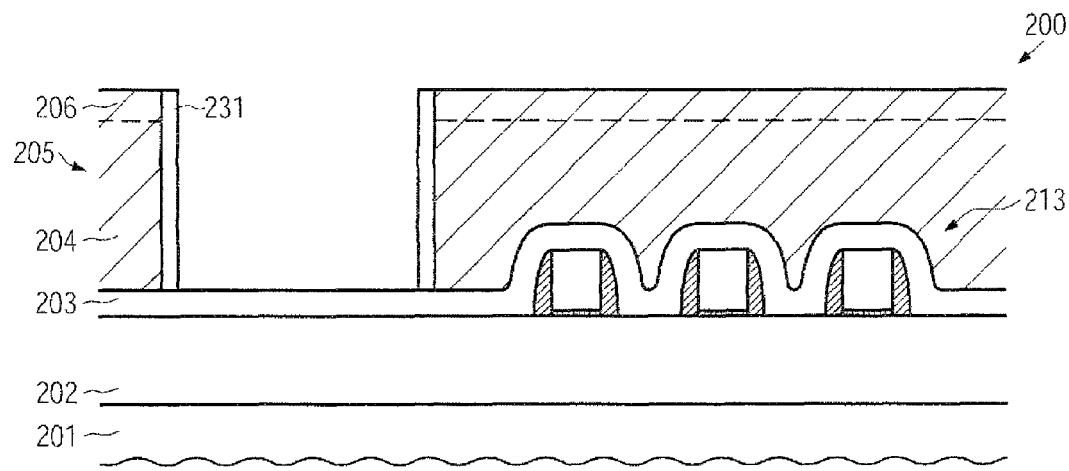

FIG. 2k schematically illustrates the semiconductor device 200 in a further advanced manufacturing stage, in which an appropriate etch process may have been performed to the remove the dielectric material from the bottom of the trenches 224A, 224B, thereby exposing the contact plugs 222A, 222B that may have been previously formed as described above. In other illustrative embodiments, when the contact plugs 222A, 222B are still to be formed, a further masking step may be performed prior to the etch process 208 by covering the trenches 224A, 224B while exposing respective openings for the contact plugs and etching the exposed layer 203 in combination with the barrier material previously deposited. Thus, in this case, the contact regions 223C may be exposed (see FIGS. 2d and 2e) and the respective contact plugs may be formed in a common patterning sequence for the trenches 224A, 224B. In the embodiment shown in FIG. 2k, it may be assumed that the contact plugs are already provided so that the dielectric barrier material may be removed from horizontal device portions so as to expose the contact plugs 222A, 222B (FIG. 2c). Hence, a respective sidewall spacer 231, acting as a barrier material with respect to the dielectric layer 204, may be provided. It should be appreciated that the removal of the dielectric barrier material from horizontal device portions may result in a thickness reduction of the cap layer 206, while nevertheless reliably maintaining a portion thereof so as to confine the dielectric material of the layer 204.

Figure 2L:
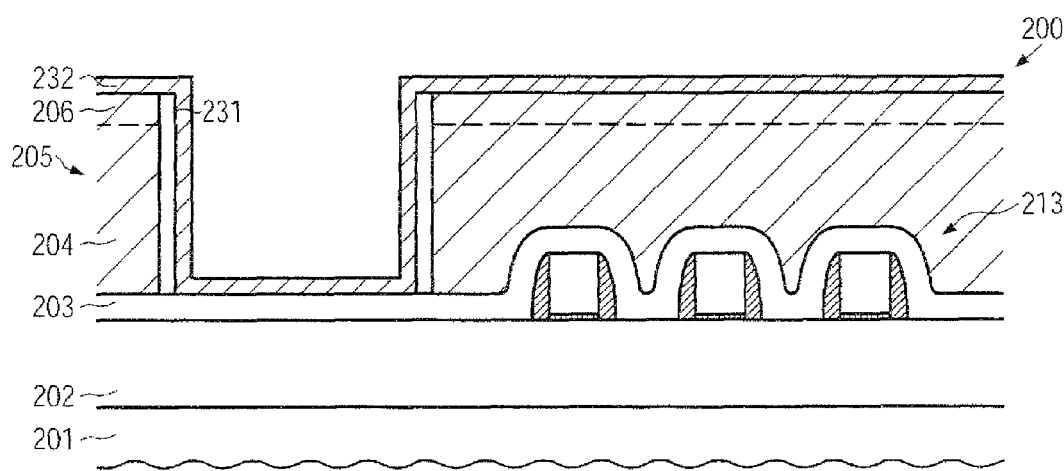

FIG. 2l schematically illustrates the semiconductor device 200 in a further advanced manufacturing stage, in which an appropriate seed layer 232 may be provided, which may be comprised of substantially the same material as is to be used for the conductive line 221B. For instance, if the line 221B is to be formed of copper, the seed layer 232 may also be provided in the form of a copper material. For this purpose, well-established deposition techniques, such as sputter deposition and the like, may be used.

Figure 2M:
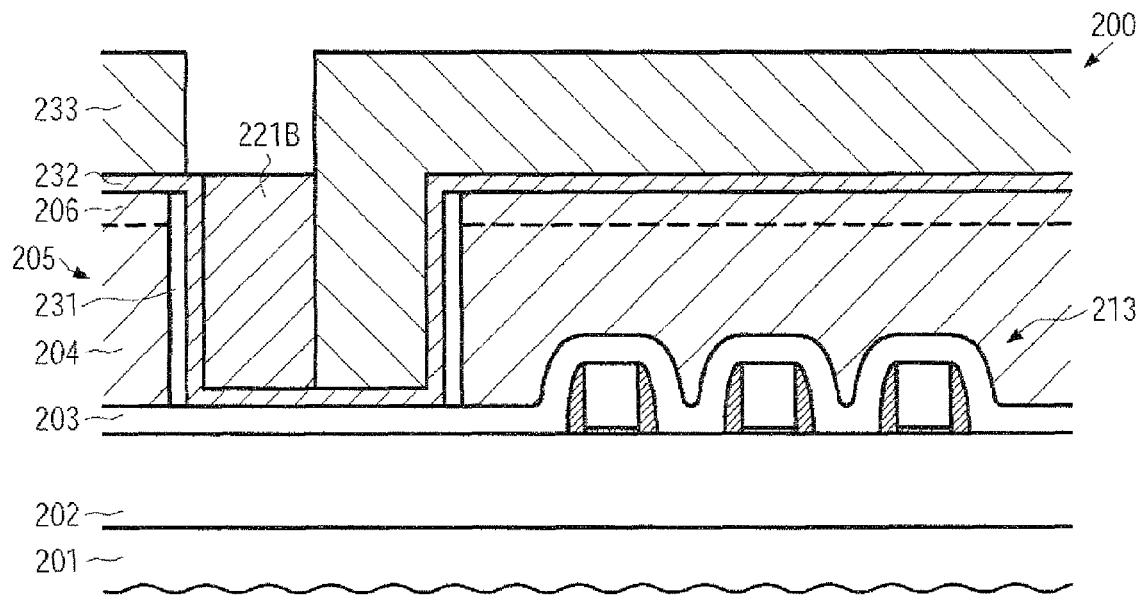

FIG. 2m schematically illustrates the device 200 in a further advanced stage in which the conductive line 221B is formed in the trench 224B, while a further resist mask 233 may cover the trench 224A and other device regions outside the trench 224B. The conductive line 221B may be formed on the basis of well-established electrochemical deposition techniques, in which, for instance, respective recipes for copper are well established so as to obtain a desired bottom-to-top fill behavior, while the resist mask 233 efficiently restricts the copper growth to the trench 224B. Thereafter, the mask 233 may be removed and the seed layer 232 may also be removed, for instance, on the basis of an electrochemical etch process and the like. It should be appreciated that a respective material loss of the conductive line 221B may be less critical, since a minor reduction of overall conductivity due to a reduction of the cross-sectional area may not substantially negatively affect the thermoelectric effect. After the removal of the seed layer 232, a further seed layer 234 may be formed that has the appropriate material composition for the conductive line 221A. For instance, a constantan material may be deposited, for instance, by sputter deposition and the like. In still other illustrative embodiments, the seed layer 232 may be maintained and may be appropriately treated, for instance, by incorporating nickel so as to obtain the desired alloy as will also be used for the conductive line 221A. For this purpose, an appropriate plasma treatment, implantation techniques, a deposition of nickel material with a subsequent thermal treatment and the like may be employed.

Figure 2N:
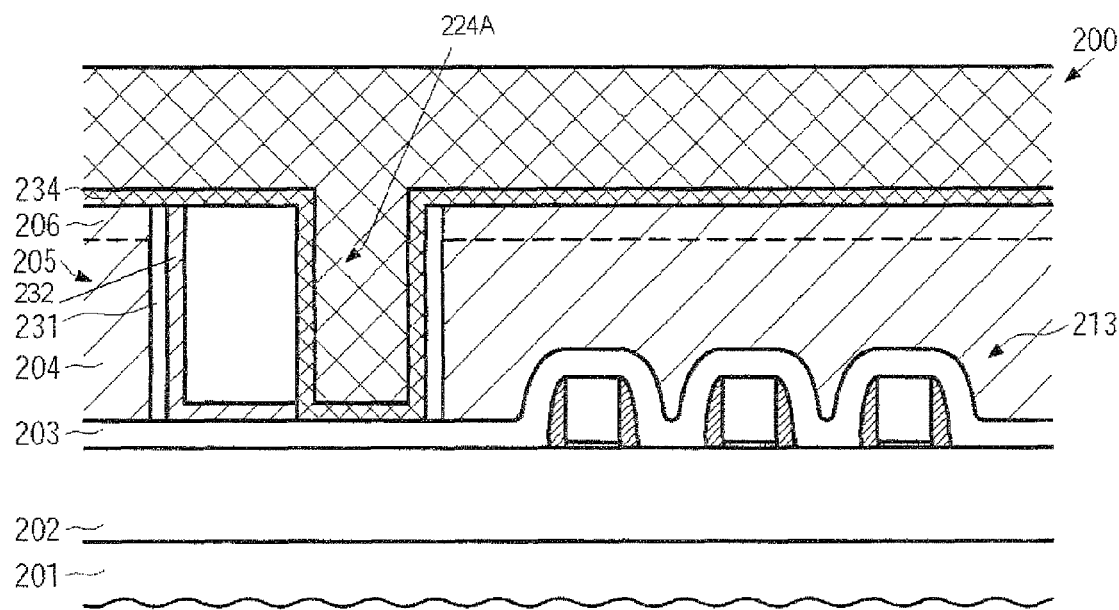

FIG. 2n schematically illustrates the device 200 after a further electroplating process to fill the trench 224A with an appropriate material, such as a copper-nickel alloy, as previously explained. During the corresponding electroplating process, the previously formed seed layer 232 may act as a current distribution layer, wherein also appropriate deposition techniques may be used so as to ensure a bottom-to-top fill behavior.

Figure 2O:
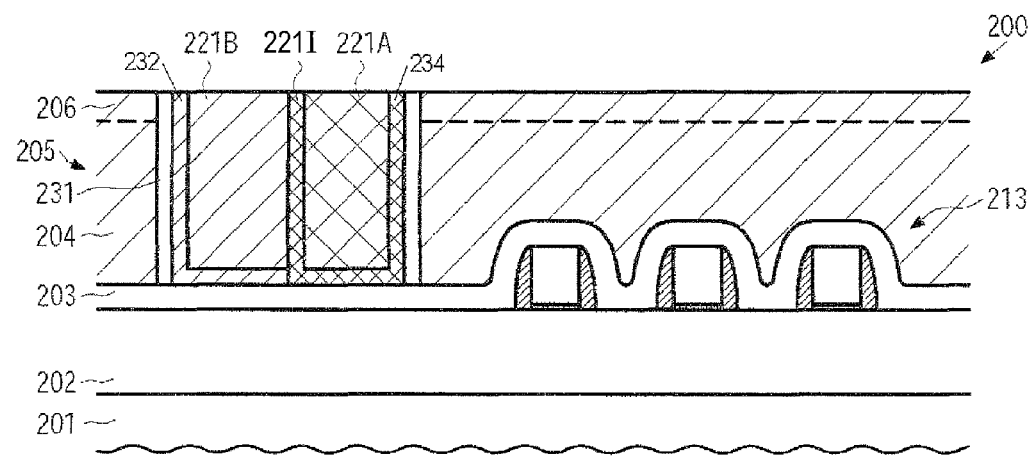
FIG. 2o schematically illustrates a cross-sectional view of a "tip" portion and a contact area of a thermocouple formed by an electroless plating technique, according to further illustrative embodiments.

FIG. 2o schematically illustrates the device 200 after the removal of excess material, for instance, by CMP and/or electrochemical polishing or etching and the like. Hence, a substantially planar surface topography may be provided, while the conductive lines, 221B, 221A reliably form the interface 221I between the different materials of the lines 221A, 221B. Since the respective seed layers 232, 234 are comprised of the same material as the corresponding fill materials of the lines 221A, 221B, a "short circuit" of the interface 221I may be avoided. Furthermore, the seed layers 232, 234 may exhibit the same temperature behavior with respect to the thermoelectric effect along the lines 221A, 221B, thereby ensuring the desired generation of the temperature-dependent voltage at the contact plugs 222A, 222B without any interference of an unwanted third material component. Additionally, the sidewall spacers 231, with the etch stop layer 203, may provide reliable confinement of the conductive materials in the lines 221A, 221B, thereby eliminating the requirement for a conductive barrier material, which may otherwise significantly affect the overall thermoelectric behavior of the lines 221A, 221B.

It should be appreciated that the above-described process sequence may also be efficiently applied in situations in which the contact plugs 222A, 222B are commonly filled with the conductive lines 221A, 221B. Hence, a "dual damascene" technique may be established for the conductive lines 221A, 221B and the contact plugs 222A, 222B.

Figure 2P:
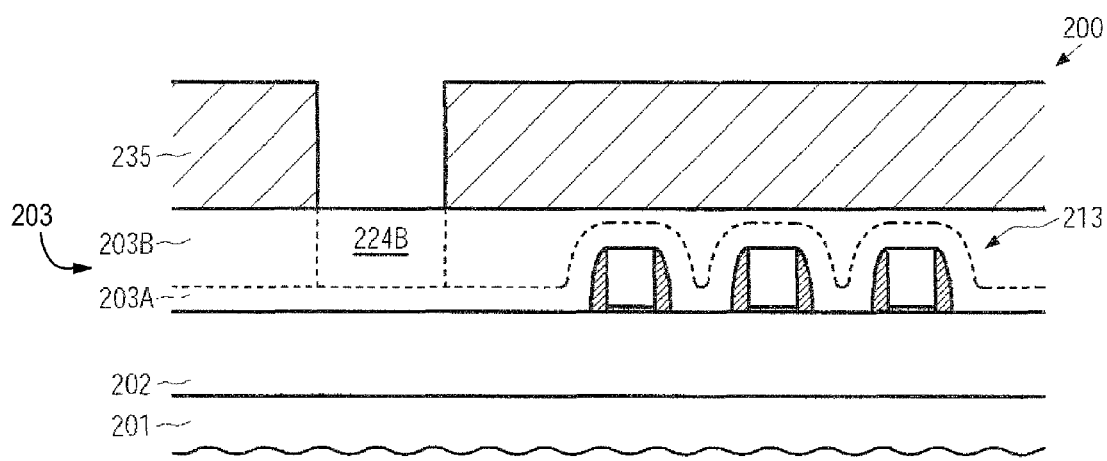
FIGS. 2p-2r schematically illustrate cross-sectional views of a "tip" portion of a thermocouple, wherein respective metal lines of the thermocouple are formed by subsequent patterning steps, according to illustrative embodiments.
Figure 2Q:
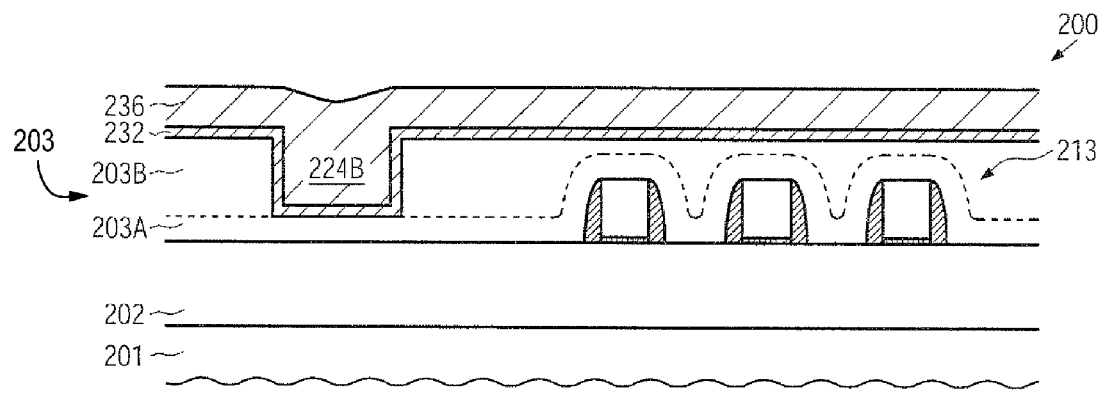
Figure 2R:
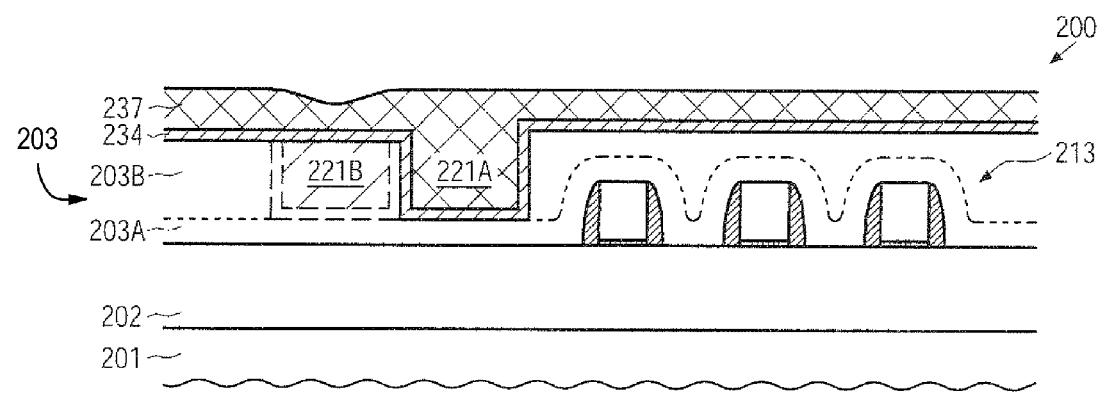

With reference to FIGS. 2p-2r, further illustrative embodiments will now be described in which the conductive lines may be embedded into a dielectric material that allows direct contact with the material for the conductive lines.

FIG. 2p schematically illustrates a cross-sectional view of the device 200 wherein, in some illustrative embodiments, the layer 203 may be provided with a substantially planar surface geometry, which may be accomplished by providing the layer 203 with a sufficient thickness or by providing a plurality of individual layers (203A, 203B . . . ), which may be subsequently planarized. In some illustrative embodiments, a first dielectric layer, such as the layer 203 as previously illustrated, may be formed and patterned so as to receive the contact plugs 222A, 222B. In other illustrative embodiments, the contact plugs may be formed commonly with the respective conductive lines as previously explained. Hence, after providing the dielectric material 203, its surface topography may be planarized, for instance, by CMP. Next, in some illustrative embodiments, an etch mask may be formed, such as the mask 207 as shown in FIG. 2j, in order to define the trenches 224A, 224B in a common patterning process. In the embodiment shown, the trenches 224A, 224B may be formed during individual patterning sequences, wherein an etch mask 235 may define the position and lateral size of the trench 224B. Next, an etch process may be performed on the basis of the mask 235, which may be stopped at any appropriate height, for instance, by connecting to the contact plug 222B, if already provided. Thereafter, the mask 235 may be removed and an appropriate seed layer may be deposited.

FIG. 2q schematically illustrates the device 200 in a further advanced manufacturing stage, in which the seed layer 232 has been used as an efficient current distribution layer for an electrochemical deposition process performed on the basis of appropriate process parameters so as to obtain the desired deposition fill behavior. For instance, the seed layer 232 and the electrochemically deposited material 236 may be comprised of a copper material. Since the dielectric material 203 may suitably confine the material of the layers 232, 236, any further barrier material may not be required. Thereafter, any excess material may be removed, for instance, by electrochemical etching, CMP and the like. Thereafter, a further etch mask may be formed in order to define the respective trench for the conductive line 221A, which may be subsequently filled with the deposition of an appropriate seed layer followed by an electrochemical deposition process.

FIG. 2q schematically illustrates the device 200 in a further advanced manufacturing stage, in which the seed layer 232 has been used as an efficient current distribution layer for an electrochemical deposition process performed on the basis of appropriate process parameters so as to obtain the desired deposition fill behavior. For instance, the seed layer and the electrochemically deposited material 236 may be comprised of a copper material. Since the dielectric material 203 may suitably confine the material of the layers 232, 236, any further barrier material may not be required. Thereafter, any excess material may be removed, for instance, by electrochemical etching, CMP and the like. Thereafter, a further etch mask may be formed in order to define the respective trench for the conductive line 221A, which may be subsequently filled with the deposition of an appropriate seed layer followed by an electrochemical deposition process.

FIG. 2r schematically illustrates the device 200 after the above-described process sequence. Hence, the seed layer 234 and the actual fill material layer 237 are provided, thereby defining the conductive line 221A adjacent and in contact with the conductive line 221B. It should be appreciated that a reliable contact of the lines 221A, 221B may be achieved by appropriately positioning the respective etch mask such that a portion of the line 221B may be exposed to the etch ambient and/or by applying a certain degree of isotropic component during the etch process, thereby reliably removing any dielectric material at the interface 221I. Next, any excess material may be removed, for instance, by CMP, and the further processing may be continued, for instance, by depositing the dielectric material 204 and forming contact plugs for other circuit elements, such as the circuit elements 213.

Hence, a plurality of well-established process techniques and materials, such as copper, nickel and platinum, may be advantageously used when forming the temperature-sensitive element 221 in the interlayer dielectric material 205, wherein a reliable confinement of certain materials may also be guaranteed, for instance, on the basis of the above-described process techniques.

Figure 3:
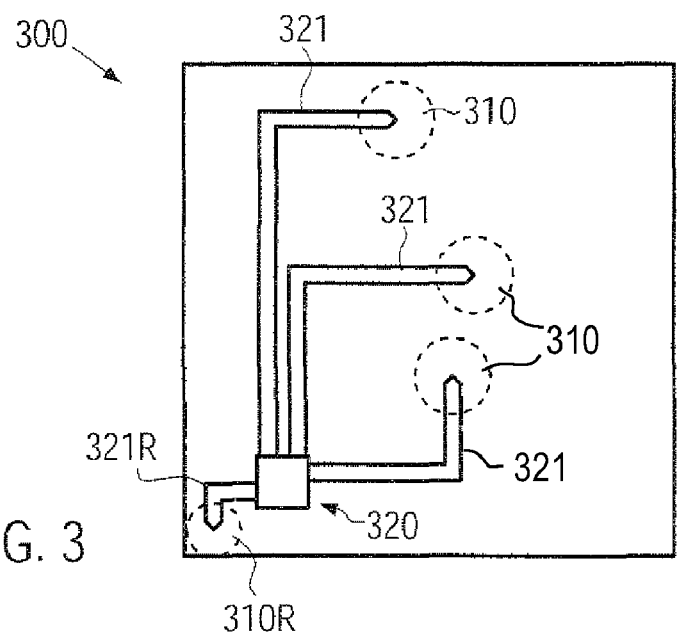
FIG. 3 schematically illustrates a top view of a semiconductor die including a plurality of thermocouples and at least one well-defined reference point, according to still further illustrative embodiments.

FIG. 3 schematically illustrates a top view of a semiconductor device 300, which may comprise one or more temperature-sensitive elements 321, as previously described with reference to the device 200. Thus, the one or more elements 321 may extend into respective measurement sites of interest 310, irrespective of any design constraints in the device layer, as previously explained. Furthermore, the device 300 may comprise a reference element 321R, which may extend into a region 310R of defined temperature conditions during operation of the device, thereby providing a reliable temperature reference for the one or more elements 321 connecting to the support circuitry 320. For example, the region 310R may be selected such that a desired temperature may be obtained, which may enable a reliable determination of a difference with respect to signals obtained from other high temperature positions 310, thereby even further enhancing the overall accuracy of the temperature management in the device 300. Due to the principles disclosed herein, the reference area 310R may be selected independently of a position of a support circuitry 320 and independently of any design constraints, which may be imposed on the device layer so that an appropriate reference point may be selected for a plurality of temperature-sensitive elements 321. For instance, the location 310R may be selected so as to provide a stable reference point substantially without being affected by local hot spots and the thermal gradient associated therewith.

Thus, based on a respective temperature-dependent voltage signal obtained by the one or more temperature-sensitive elements 321, an efficient overall temperature monitoring and, thus, controlling of the device under consideration may be achieved. For instance, upon the detection of an invalid temperature at a specified circuit portion, the operating speed of the entire device or portions thereof may be reduced or respective circuit portions or the entire circuit may be shut down by an internally supplied control unit (not shown). In still other illustrative embodiments, a corresponding temperature-dependent control signal may be supplied to an external device via I/O capabilities of the semiconductor device under consideration or by a dedicated signal path and the like.

Figure 4:
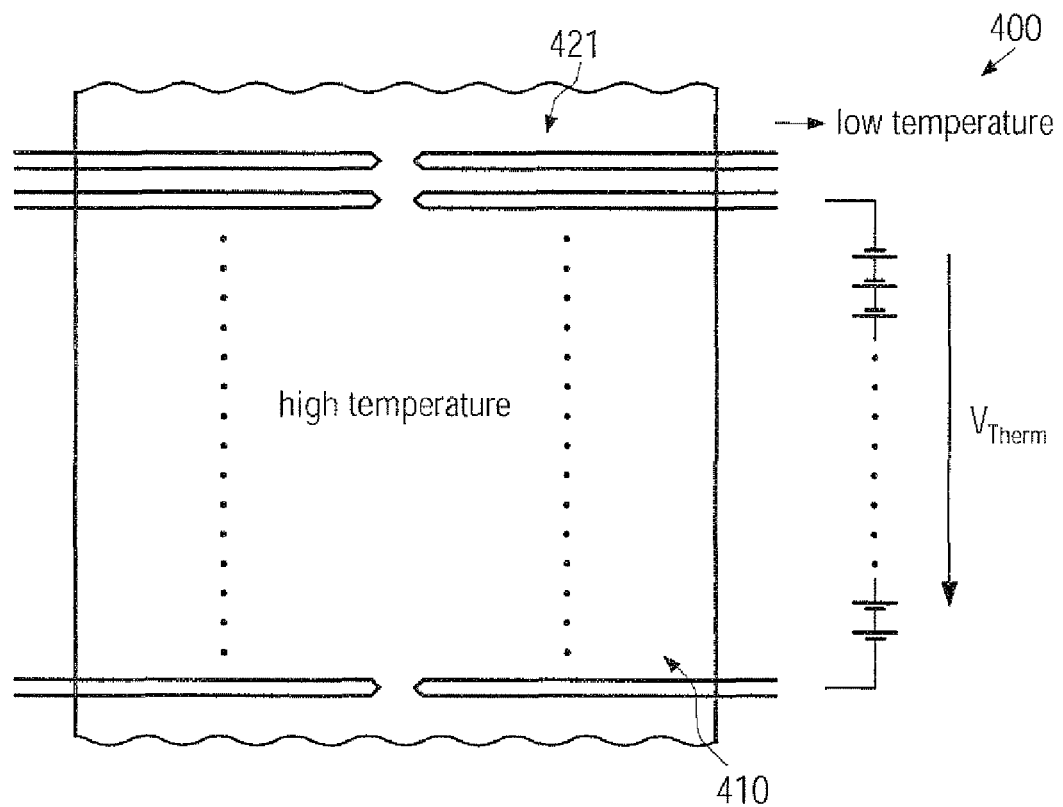
FIG. 4 schematically illustrates a top view of a portion of a semiconductor device including a plurality of thermocouples, which may be subject to substantially the same temperature conditions and which may be appropriately electrically connected so as to enhance output power, output voltage and the like, thereby improving temperature control of the respective semiconductor area, according to still further illustrative embodiments.

FIG. 4 schematically illustrates a semiconductor device 400 in which a plurality of thermocouples 421 may be appropriately connected to each other so as to enhance the overall control efficiency. For example, the plurality of thermocouples 421 may extend into a region of interest 410, which may represent a temperature-sensitive area, for instance, a hot spot and the like. As previously explained, the functional principle of thermocouples resides in the fact that a temperature gradient may establish a voltage, which may be increased by connecting in series a plurality of the thermocouples 421, which, due to their common extension into the region 410, may be substantially connected in parallel with respect to their thermal behavior. That is, since essentially the same temperature conditions may prevail in the region 410, and the thermocouples 421 may terminate in a region having substantially the same temperature, all of the thermocouples 421 may substantially respond in a very similar manner. Hence, a significantly increased temperature-dependent voltage may be generated. For example, for an illustrative thermocouple comprised of copper and constantan, a temperature difference of approximately 100° C. may result in a voltage of 4.3 mV. Thus, by a serial connection of a plurality of the thermocouples 421, well-detectable temperature-dependent voltages may be created. Thus, the detection and response to even minute temperature fluctuations may be increased on the basis of a correspondingly increased output voltage of the thermocouples 421.

In some illustrative embodiments, the voltage obtained by the plurality of thermocouples 421 may be advantageously used to supply a significant portion thereof to the supply voltage of the device 400 which may enhance the overall efficiency of the device 400 and may also contribute to an efficient heat dissipation from the region 410. As is well known, the creation of a thermoelectric voltage may result in a current flow when appropriately connecting the end portions of the thermocouples 421, thereby also resulting in a heat dissipation, since the induced current flow may reduce the temperature at the hot side, while increasing the temperature at the cold side of the thermocouples. Consequently, an additional heat dissipation mechanism may be provided, while concurrently or alternatively a portion of the distributed heat may be converted into electrical power which may be fed into the supply voltage source of the device 400.

As a result, the present disclosure relates to methods and semiconductor devices in which temperature-sensitive elements may be provided within the contact structure of the device, thereby reducing the amount of semiconductor area occupied by temperature-related circuitry, while nevertheless providing the potential of routing the temperature-sensitive element to any desired device location. Thus, spatial coverage and accuracy of temperature control in semiconductor devices may be improved, while also enabling the employment of well-established process techniques and materials.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a semiconductor layer formed above a substrate;
a first circuit element formed in said semiconductor layer, said first circuit element comprising a contact region and being adapted to receive a temperature-dependent signal;
an interlayer dielectric material formed above said first circuit element;
a contact element formed in said interlayer dielectric material and connecting to said contact region of said first circuit element;
a first conductive line positioned in a first trench formed in said interlayer dielectric material;
a second conductive line positioned in a second trench formed in said interlayer dielectric material; and
a temperature-sensitive element formed in said interlayer dielectric material and configured to provide a temperature-dependent signal, said temperature-sensitive element comprising an interface portion positioned proximate to a second circuit element, wherein said interface portion comprises a contact interface between a portion of said first conductive line and a portion of said second conductive line and being is adapted to enable determination of a local temperature caused by said second circuit element during operation.

2. The semiconductor device of claim 1, wherein said temperature-sensitive element further comprises an extension portion connected to said interface portion.

3. The semiconductor device of claim 2, wherein said interface portion comprises an interface formed by a first conductive material and a second conductive material, said first and second conductive materials differing in material composition.

4. The semiconductor device of claim 3, wherein said extension portion comprises a first conductive line comprised of said first conductive material and a second conductive line comprised of said second conductive material.

5. The semiconductor device of claim 1, wherein said interlayer dielectric material comprises an etch stop layer and a dielectric layer formed above said etch stop layer and wherein said temperature-sensitive element is at least partially formed in said dielectric layer.

6. The semiconductor device of claim 5, further comprising one or more additional circuit elements formed in said semiconductor layer and a first contact element and a second contact element formed in said interlayer dielectric material, said first and second contact elements connecting said temperature-sensitive element to said one or more additional circuit elements.

7. The semiconductor device of claim 6, wherein said temperature-sensitive element comprises a first conductive line connected to said first contact element and a second conductive line connected to said second contact element.

8. The semiconductor device of claim 1, further comprising a second temperature-sensitive element formed in said interlayer dielectric material, said second temperature-sensitive element positioned in a location corresponding to a lower gradient of operating temperatures compared to a gradient of operating temperatures corresponding to a location of said temperature-sensitive element.

9. The semiconductor device of claim 1, wherein said first conductive line comprises a first material and said second conductive line comprises a second material having a different material composition than said first material.

10. The semiconductor device of claim 1, wherein said contact interface comprises a substantially vertical contact interface.

11. A semiconductor device, comprising:
 a plurality of circuit elements formed in and above a semiconductor layer;
 a support circuit element formed above said semiconductor layer, said support circuit element being adapted to receive a temperature-dependent signal from a thermocouple;
 an interlayer dielectric material enclosing said plurality of circuit elements and said support circuit element, said interlayer dielectric material having first and second trenches formed therein; and
 a thermocouple formed in said interlayer dielectric material and connected to said support circuit element, wherein said thermocouple comprises first and second conductive lines positioned in said first and second trenches, respectively, wherein a portion of said first conductive line contacts a portion of said second conductive line at an interface positioned at a first location that is proximate to at least one of said plurality of circuit elements, and wherein said thermocouple is adapted to determine a local temperature caused by said at least one of said plurality of circuit elements during operation.

12. The semiconductor device of claim 11, said support circuit element further comprising a first contact element and a second contact element, said first and second conductive lines connecting said first and second contact elements to one or more of said plurality of circuit elements.

13. The semiconductor device of claim 12, wherein said interlayer dielectric material comprises an etch stop layer and a dielectric layer and wherein said first and second contact elements are formed in said etch stop layer and said first and second conductive lines are formed in said dielectric layer.

14. The semiconductor device of claim 11, further comprising a reference thermocouple connected to said support circuit element, wherein an interface of said reference thermocouple is positioned at a second location having a lower temperature during operation compared to a temperature corresponding to a said first location of said thermocouple.

15. The semiconductor device of claim 11, wherein said thermocouple comprises a first metal in said first conductive line and a second metal in said second conductive line, said first and second metals differing from each other.

16. The semiconductor device of claim 11, wherein said thermocouple comprises copper.

17. The semiconductor device of claim 11, wherein said interface comprises a substantially vertical interface between said portion of said first conductive line and said portion of said second conductive line.

\* \* \* \* \*